United States Patent
Imade et al.

(10) Patent No.: US 6,764,921 B2
(45) Date of Patent: Jul. 20, 2004

(54) SEMICONDUCTOR DEVICE AND METHOD FOR FABRICATING THE SAME

(75) Inventors: Masahiro Imade, Osaka (JP); Hiroyuki Umimoto, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/630,800

(22) Filed: Jul. 31, 2003

(65) Prior Publication Data

US 2004/0063299 A1 Apr. 1, 2004

(30) Foreign Application Priority Data

Oct. 1, 2002 (JP) ......................................... 2002-288531

(51) Int. Cl.[7] .............................................. H01L 21/76
(52) U.S. Cl. ...................... 438/424; 438/435; 438/400; 438/404; 438/236; 438/295; 438/296; 438/219; 257/622; 257/374
(58) Field of Search ................................. 438/435, 424, 438/400, 404, 236, 295, 296, 219, 218, 207; 257/622, 374

(56) References Cited

U.S. PATENT DOCUMENTS

| | | | | |
|---|---|---|---|---|
| 5,256,591 A | * | 10/1993 | Jun | 438/424 |
| 5,275,965 A | * | 1/1994 | Manning | 438/430 |
| 5,897,361 A | * | 4/1999 | Egawa | 438/435 |
| 5,994,756 A | * | 11/1999 | Umezawa et al. | 257/510 |
| 6,281,081 B1 | * | 8/2001 | Chien et al. | 438/296 |
| 6,436,790 B2 | * | 8/2002 | Ito | 438/424 |
| 2002/0105034 A1 | * | 8/2002 | Iwata et al. | 257/368 |
| 2003/0107103 A1 | * | 6/2003 | Iwata et al. | 257/506 |

FOREIGN PATENT DOCUMENTS

| | | | | |
|---|---|---|---|---|
| JP | 05-304205 | * | 11/1993 | H01L/21/76 |
| JP | 11-26571 | | 1/1999 | |
| JP | 11-176924 | * | 7/1999 | H01L/21/76 |

OTHER PUBLICATIONS

G. Scott et al., NMOS Drive Current Reduction Caused By Transistor Layout And Trench Isolation Induced Stress, IEDM 99–827, pp. 34.4 1–34.4.4, 1999 IEEE.*

* cited by examiner

Primary Examiner—Matthew Smith
Assistant Examiner—Belur Keshavan
(74) Attorney, Agent, or Firm—McDermott, Will & Emery

(57) ABSTRACT

A semiconductor device of the present invention includes a MISFET provided in an element formation region Re of a semiconductor substrate 11 and a trench isolation 13 surrounding the sides of the element formation region Re. An oxygen-passage-suppression film 23 is provided from the top of the trench isolation 13 to the top of a portion of the element formation region Re adjacent to the trench isolation 13. The oxygen-passage-suppression film 23 is made of a silicon nitride film or the like through which oxygen is less likely to permeate. Therefore, since it becomes hard that the upper edge of the element formation region Re of the semiconductor substrate 11 is oxidized, an expansion of the volume of the upper edge is suppressed, thereby reducing a stress.

14 Claims, 6 Drawing Sheets

SEMICONDUCTOR DEVICE AND METHOD FOR FABRICATING THE SAME

BACKGROUND OF THE INVENTION (a) Field of the Invention

The present invention relates to a semiconductor device and a method for fabricating the same, and more particularly to a semiconductor device including a trench isolation structure and a method for fabricating the same.

(b) Description of the Related Art

One of methods for electrically isolating elements on a semiconductor substrate is a trench isolation method. The trench isolation method is one in which a trench having an appropriate depth is dug in a region of the semiconductor substrate between elements and an insulator is buried therein so as to isolate the elements. This method is disclosed in Japanese Unexamined Patent Publication No. 11-26571, for example.

A method for fabricating a trench isolation structure according to a known semiconductor device will be described hereinafter with reference to FIGS. 5A through 5F. FIGS. 5A through 5F are cross sectional views showing process steps for fabricating the trench isolation structure according to the known semiconductor device.

First, in the process step shown in FIG. 5A, the surface of the semiconductor substrate 51 is oxidized so as to form a thermal oxide film 52. Subsequently, semiconductor nitride is deposited on the thermal oxide film 52 using a chemical vapor deposition (CVD) method, thereby forming a nitride film 53.

Next, in the process step shown in FIG. 5B, a mask 54 having an opening on an isolation region is formed on the nitride film 53 by photolithography. Anisotropic etching is performed using the mask 54, whereby the semiconductor substrate 51 is etched through the nitride film 53 and the thermal oxide film 52 to a predetermined depth so as to form a trench 55.

Next, in the process step shown in FIG. 5C, after the mask 54 is removed, a first oxide film 56 is formed on the surface of the semiconductor substrate 51 exposed in the trench 55 by a thermal oxidation method.

Next, in the process step shown in FIG. 5D, a second oxide film 57 is formed on the substrate to fill the trench 55 by a high-density plasma CVD method or the like.

Subsequently, in the process step shown in FIG. 5E, the second oxide film 57 is planarized by a chemical mechanical polishing (CMP) method or the like. The second oxide film 57 is planarized until the top of the nitride film 53 is exposed.

Next, in the process step shown in FIG. 5F, the nitride film 53 and the thermal oxide film 52 are removed by selective etching, thereby forming a trench isolation 58 having the trench 55 filled with the first oxide film 56 and the second oxide film 57. When the thermal oxide film 52 is removed, the upper part of the second oxide film 57 is similarly removed. More particularly, since the upper edge of the second oxide film 57 is easily removed, a depression 59 is formed.

However, the known semiconductor device having the above-mentioned trench isolation structure causes the following problems.

After the formation of the trench isolation 58, the known semiconductor device is formed through a thermal oxidation process step for forming a gate dielectric and a heat treating process step such as thermal diffusion after impurity ion implantation. In such process steps, oxidation progresses in a portion of the semiconductor substrate contacting the upper end of the trench isolation structure.

FIG. 6 is a cross sectional view showing a process step for thermally oxidizing the upper part of the semiconductor substrate to form a gate dielectric 60 according to the known semiconductor device. As shown in FIG. 6, oxygen is supplied not only from above but also from the trench isolation 58 to the upper end of an element formation region of the semiconductor substrate 51, resulting in overoxidized regions 61 grown therein. When the overoxidized regions 61 are grown, the volumes of the regions expand so that stresses are produced, and thus crystal defects easily take place in the semiconductor substrate. Therefore, a leakage current easily flows through the crystal defects so that the isolation capability might be reduced.

When an element formed in the element formation region of the semiconductor substrate 51 is an N-type MISFET (metal insulator semiconductor field effect transistor), the mobility of electrons is decreased due to the stresses given from the overoxidized regions 61, whereby the drive current of the transistor is also reduced.

SUMMARY OF THE INVENTION

It is an object of the present invention to provide a semiconductor device in which stresses given from a trench isolation to element formation regions can be suppressed to decrease a leakage current resulting from crystal defects and a method for fabricating the same.

It is another object of the present invention to provide a high reliability and high performance semiconductor device preventing the drive current of an n-type MISFET from being reduced.

A semiconductor device of the present invention comprises: a semiconductor layer including an element formation region; a trench isolation surrounding the element formation region of the semiconductor layer; and a coating film having the property of suppressing passage of oxygen, said coating film covering at least a portion of the trench isolation and a portion of the element formation region astride the border between the trench isolation and the element formation region.

Thereby, it becomes hard that the upper edge of the element formation region of the semiconductor layer is oxidized, and thus it becomes hard that an expansion of the volume of the upper edge takes place. Therefore, the occurrence of a stress can be suppressed, thereby suppressing the occurrence of a leakage current.

The coating film directly contacts the semiconductor layer. Therefore, oxidation of the upper edge of the semiconductor layer is suppressed in a process step for fabricating a semiconductor device.

The semiconductor device further comprises an element including: source/drain regions provided in the element formation region of the semiconductor layer; a gate dielectric formed by thermally oxidizing the top of the element formation region of the semiconductor layer; and a gate electrode provided on the gate dielectric. In this case, even when the semiconductor layer is thermally oxidized to form the gate dielectric, oxidation of the upper edge of the element formation region could be reduced.

The element may be an n-type MISFET. In this case, the occurrence of a stress is suppressed to improve the mobility of electrons. Therefore, the drive current thereof can be improved.

It is preferable that the coating film is formed of silicon nitride.

A plurality of the element formation regions may be provided, and the coating film may cover the top of the trench isolation and extend to the two element formation regions of the semiconductor layer adjacent to the trench isolation.

A depression is provided on the upper edge of the trench isolation, and the coating film extends from the bottom of the depression to the top of the element formation region. Therefore, the surface of the substrate is more planarized.

A first method for fabricating a semiconductor device of the present invention comprises the steps of: (a) forming a trench isolation surrounding an element formation region in a semiconductor layer; (b) forming a coating film having the property of suppressing passage of oxygen to lie from the top of the semiconductor layer to the top of the trench isolation; and (c) removing a portion of the coating film to form a partial coating film that covers at least a portion of the trench isolation and a portion of the element formation region of the semiconductor layer astride the border between the trench isolation and the element formation region.

Thereby, it becomes hard that the upper edge of the element formation region of the semiconductor layer is oxidized after the step (c), and thus it becomes hard that an expansion of the volume of the upper edge takes place. Since the occurrence of a stress can therefore be suppressed, a semiconductor device less likely to produce a leakage current can be fabricated.

The method for fabricating a semiconductor device further comprises the steps of: (d) thermally oxidizing an upper part of the element formation region of the semiconductor layer after the step (c) to form a gate dielectric; (e) forming a gate electrode on the gate dielectric; and (f) forming source/drain regions in the element formation region by using the gate electrode as a mask. In this case, the upper edge of the element formation region is covered with a partial coating film in the step (e), thereby suppressing oxidation of the upper edge.

It is preferable that, in the step (b), the coating film is formed of silicon nitride.

A second method for fabricating a semiconductor device of the present invention comprises the steps of: (a) forming a trench isolation surrounding an element formation region in a semiconductor layer; (b) forming a mask having an opening allowing the top of the trench isolation and the top of a portion of the element formation region adjacent to the trench isolation to be exposed; (c) forming, on the mask, a coating film covering the sides and the bottom of the opening and having the property of suppressing passage of oxygen; (d) removing an upper part of the mask and an upper part of the coating film to form a partial coating film that covers a portion of the trench isolation and a portion of the element formation region astride the border between the trench isolation and the element formation region; and (e) removing the remaining mask.

Thereby, it becomes hard that the upper edge of the element formation region of the semiconductor layer is oxidized after the step (d), and thus it becomes hard that an expansion of the volume of the upper edge takes place. Since the occurrence of a stress can therefore be suppressed, a semiconductor device less likely to produce a leakage current can be fabricated.

The method for fabricating a semiconductor device further comprises the steps of: (f) thermally oxidizing an upper part of the element formation region of the semiconductor layer after the step (e) to form a gate dielectric; (g) forming a gate electrode on the gate dielectric; and (h) forming source/drain regions in the element formation region by using the gate electrode as a mask. In this case, the upper edge of the element formation region is covered with a partial coating film in the step (g), thereby suppressing oxidation of the upper edge.

In the step (a), a depression is formed in the upper edge of the trench isolation, and in the step (d), the partial coating film is formed to extend from the bottom of the depression to the top of the element formation region. Therefore, the surface of the substrate can be more planarized.

It is preferable that, in the step (c), the coating film is formed of silicon nitride.

DESCRIPTION OF THE PREFERRED EMBODIMENTS

Embodiments of the present invention will be described hereinafter with reference to the drawings.

(Embodiment 1)

Figure 1:
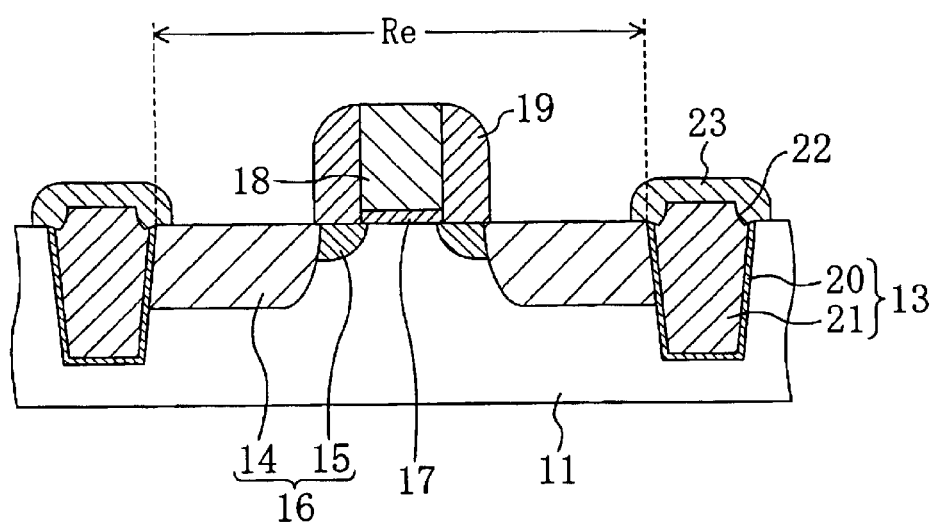
FIG. 1 is a cross sectional view showing the structure of a semiconductor device according to a first embodiment.

A semiconductor device of this embodiment is characterized in that a surface portion of the semiconductor substrate lying from the top of a trench isolation to a portion of an element formation region located around the trench isolation is covered with an oxygen-passage-suppression film for suppressing an oxygen supply. The structure of a semiconductor device of this embodiment will be described hereinafter with reference to FIG. 1. FIG. 1 is a cross sectional view showing the structure of the semiconductor device according to a first embodiment.

As shown in FIG. 1, the semiconductor device of this embodiment comprises a MISFET provided in an element formation region Re of a semiconductor substrate 11 and a trench isolation 13 surrounding the sides of the element formation region Re.

The MISFET is formed of: n-type source/drain regions 16 each consisting of a heavily doped layer 14 and a lightly doped layer 15; a gate dielectric 17 which is provided on a region of the semiconductor substrate 11 interposed between the source/drain regions 16 and which is made of a silicon oxide film having a thickness of 2 nm; a gate electrode 18 provided on the gate dielectric 17 and made of polysilicon having a thickness of 150 nm; and an insulative sidewall 19 provided on the sides of the gate electrode 18 and made of a silicon oxide film having a width of 60 nm.

The trench isolation 13 is formed of a first oxide film 20 covering the inner surface of the trench and a second oxide film 21 with which the trench is filled in a manner of interposing the first oxide film 20 therebetween. A depression 22 is formed in the upper edge of the trench isolation 13. This depression 22 is formed at the timing that the trench isolation 13 is formed.

An oxygen-passage-suppression film 23 having a thickness of 80 nm is provided across the top of the trench isolation 13 to the top of a portion of the element formation region Re of the semiconductor substrate 11 adjacent to the trench isolation 13. The oxygen-passage-suppression film 23 covers the entire top surface of the trench isolation 13 and extends from each upper edge of the trench isolation 13 to the top of the element formation region Re by a distance of approximately 40 nm.

The oxygen-passage-suppression film 23 is provided in the process step for the purpose of preventing the upper edge of the element formation region Re of the semiconductor substrate 11 from being overoxidized. As the oxygen-passage-suppression film 23, a non-conductive and less-oxygen-permeable material is desirably employed, and silicon nitride, for example, is suitable.

The sidewall 19 may be made of a layered structure of at least one silicon oxide film and at least one silicon nitride film.

Next, methods for fabricating a semiconductor device according to this embodiment will be described. There are two methods for fabricating the same. Between them, a first method will be initially described with reference to FIGS. 2A through 2D. FIGS. 2A through 2D are cross sectional views showing process steps for fabricating an oxygen-passage-suppression film 23 in the first method for fabricating a semiconductor device according to the first embodiment. Here, an illustration of the MISFET or the like is omitted.

Figure 2A:
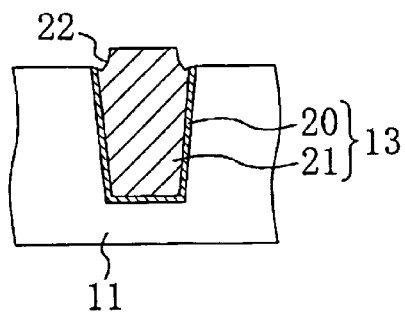
FIGS. 2A through 2D are cross sectional views showing process steps for fabricating an oxygen-passage-suppression film 23 in a first method for fabricating a semiconductor device according to the first embodiment.

First, in the process step shown in FIG. 2A, a trench isolation 13 consisting of a first oxide film 20 and a second oxide film 21 is formed in a semiconductor substrate 11 using the similar method as described in the BACKGROUND OF THE INVENTION. At this time, a depression 22 is formed in the upper edge of the trench isolation 13.

Figure 2D:
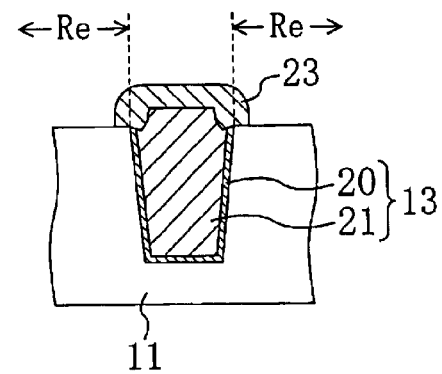
Figure 2B:
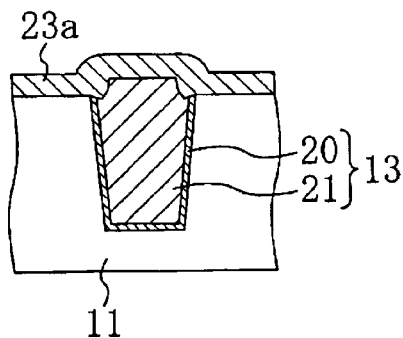

Next, in the process step shown in FIG. 2B, a silicon nitride film 23a is deposited on the substrate to cover the trench isolation 13.

Figure 2C:
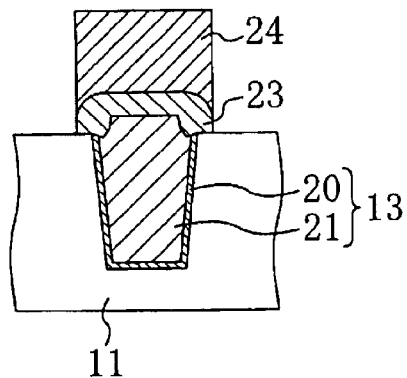

Next, in the process step shown in FIG. 2C, a protection film 24 made of a CVD (chemical vapor deposition) oxide film is formed by photolithography and etching to lie from the top of the trench isolation 13 to the tops of regions of the semiconductor substrate 11 located on the sides of the trench isolation 13. The silicon nitride film 23a is subjected to wet-etching in thermal phosphoric acid, using the protection film 24 as a mask, thereby forming an oxygen-passage-suppression film 23.

The oxygen-passage-suppression film 23 need only cover the trench isolation 13 completely and be overlapped with the semiconductor substrate 11 to the extent that the first oxide film 20 and the second oxide film 21 are not exposed.

The protection film 24 may be a BPSG (boron phosphorous silicate glass) film or the like allowing the silicon nitride film 23a (oxygen-passage-suppression film 23) and the semiconductor substrate 11 to be subjected to selective etching.

Next, in the process step shown in FIG. 2D, the protection film 24 is removed. Thereafter, an element such as a MISFET is formed in the element formation region Re of the semiconductor substrate 11.

Next, a second method for fabricating a semiconductor device according to the first embodiment will be described with reference to FIGS. 3A through 3E. FIGS. 3A through 3E are cross sectional views showing process steps for fabricating an oxygen-passage-suppression film 23 in the second method for fabricating a semiconductor device according to the first embodiment.

Figure 3A:
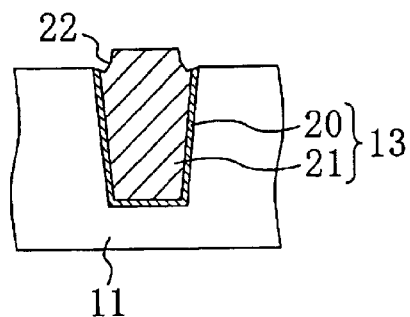
FIGS. 3A through 3E are cross sectional views showing process steps for fabricating the oxygen-passage-suppression film 23 in a second method for fabricating a semiconductor device according to the first embodiment.

First, in the process step shown in FIG. 3A, a trench isolation 13 consisting of a first oxide film 20 and a second oxide film 21 is formed in the similar method as described in the BACKGROUND OF THE INVENTION.

Figure 3D:
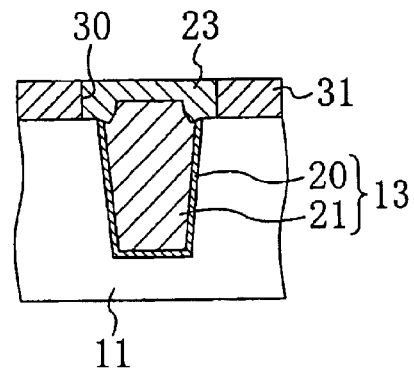
Figure 3B:
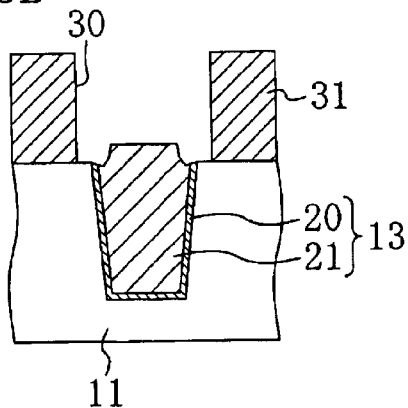

Next, in the process step shown in FIG. 3B, a protection film 31 having an opening 30 and made of a BPSG film is formed by photolithography and etching. The opening 30 allows the top of the trench isolation 13 and the tops of regions of the semiconductor substrate 11 located in the vicinity of the borders thereof with the trench isolation 13 to be exposed. The protection film 31 need only be a film allowing a burying material of the trench isolation 13 and the semiconductor substrate 11 to be subjected to selective etching.

Figure 3E:
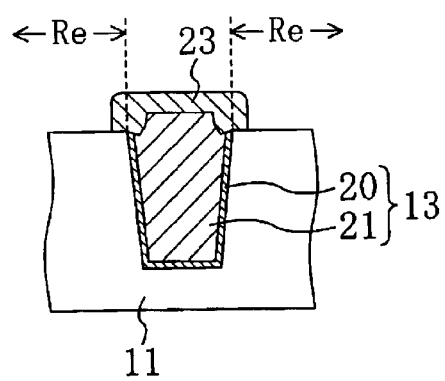
Figure 3C:
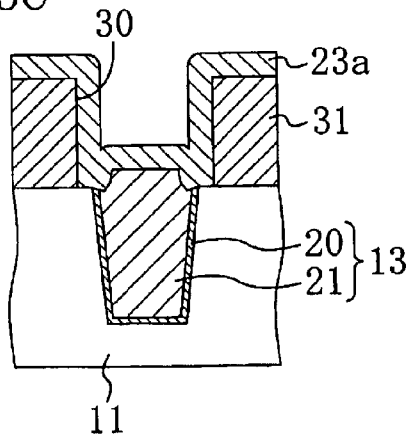

Next, in the process step shown in FIG. 3C, a silicon nitride film 23a is deposited to cover the inner surface of the opening 30 and extend to the top of the protection film 31.

Next, in the process step shown in FIG. 3D, the surface of the substrate is planarized by CMP or the like. This planarization is performed until it reaches at least the top of a portion of the silicon nitride film 23a located on the trench isolation 13. Thereby, the oxygen-passage-suppression film 23 is formed to cover from the top of the trench isolation 13 to the tops of portions of the semiconductor substrate 11 located in the vicinity of the sides of the trench isolation 13.

Next, in the process step shown in FIG. 3E, the remaining protection film 31 is removed. An element such as a MISFET is formed in the element formation region Re of the semiconductor substrate 11.

According to this embodiment, after the formation of the oxygen-passage-suppression film 23, oxidation for forming the gate dielectric 17 (shown in FIG. 1), heat treatment for diffusing impurity ions and the like are performed. Therefore, it becomes hard to supply oxygen to a portion of the element formation region Re bordering on the trench isolation 13. Thus, an expansion of the volume of that portion can be suppressed so that the occurrence of a stress can be also suppressed. Therefore, the semiconductor substrate becomes less likely to cause crystal defects, thereby avoiding the occurrence of a leakage current.

When the n-type MISFET is formed in the element formation region Re of the semiconductor substrate 11, a stress given to the element formation region Re is reduced so that the mobility of electrons is improved. Therefore, the drive current of the element can be also improved.

(Embodiment 2)

In this embodiment, a description will be given of the case where the top of a border between a trench isolation and each of element formation regions is covered with an oxygen-passage-suppression film without the whole of the top of the trench isolation being covered with the oxygen-passage-suppression film.

Figure 4:
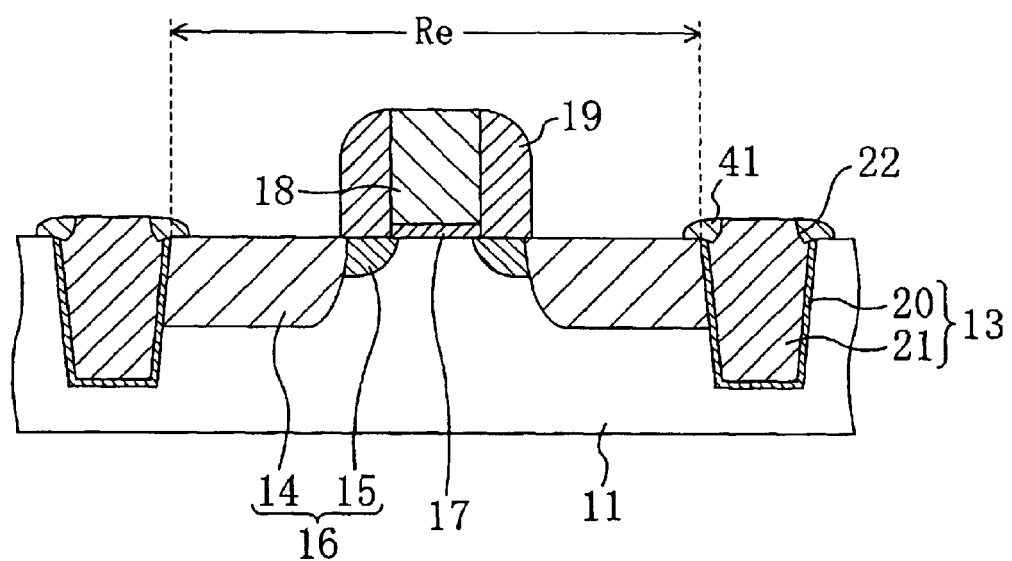
FIG. 4 is a cross sectional view showing the structure of a semiconductor device according to a second embodiment.
Figure 5A:
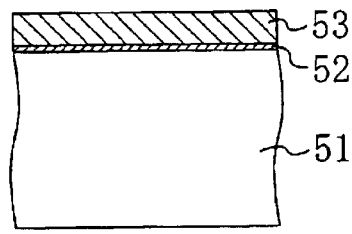
FIGS. 5A through 5F are cross sectional views showing process steps for fabricating a trench isolation structure according to a known semiconductor device.
Figure 5B:
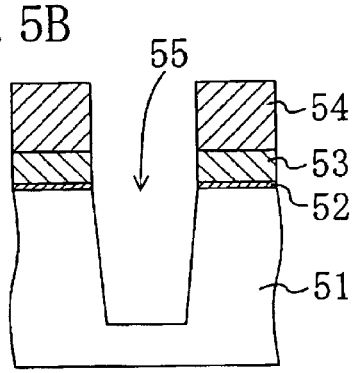
Figure 5C:
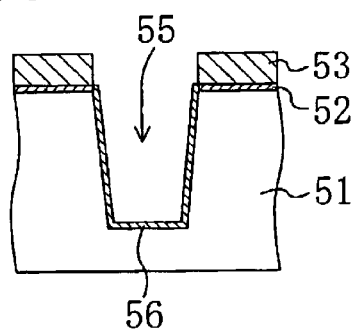
Figure 5D:
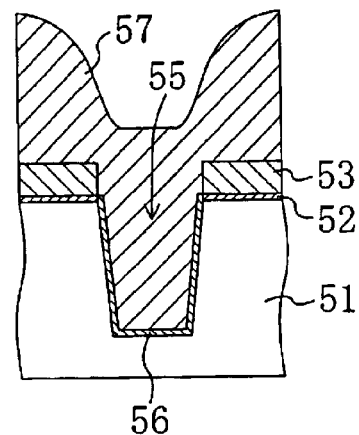
Figure 5E:
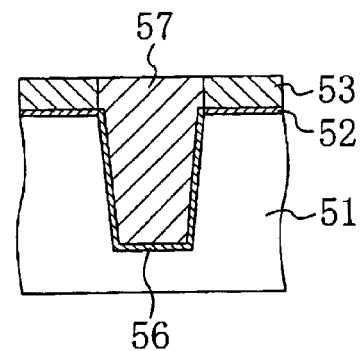
Figure 5F:
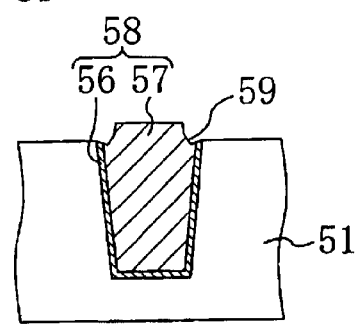
Figure 6:
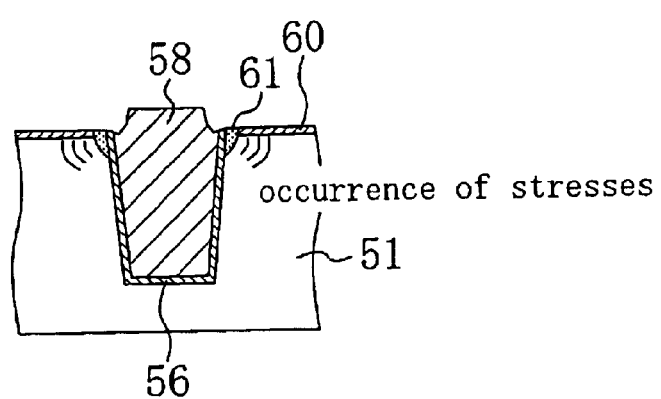
FIG. 6 is a cross sectional view showing a process step for thermally oxidizing the upper part of a semiconductor substrate to form a gate dielectric according to the known semiconductor device.

FIG. 4 is a cross sectional view showing the structure of a semiconductor device according to a second embodiment.

As shown in FIG. 4, according to the semiconductor device of this embodiment, a depression 22 is formed in the upper edge of the trench isolation 13. Usually, the depression 22 is naturally formed in a process step for forming the trench isolations 13 at the timing that a protection oxide film covering the top of the element formation region Re of the semiconductor substrate 11 is removed. However, the depression 22 may be formed gradually in the other process steps or may be formed intentionally. An oxygen-passage-suppression film 41 is formed from within the 40 nm-deep depression 22 formed in the trench isolation 13 to the upper edge of the element formation region Re of the semiconductor substrate 11. Specifically, the oxygen-passage-suppression film 41 expands from the upper edge of the trench isolation 13 to the top of the element formation region Re by a distance of 40 nm. Descriptions of the other structures are omitted, because these structures are similar to those of the first embodiment.

A method for forming an oxygen-passage-suppression film 41 of this embodiment will be described below. According to the second fabrication method of the first embodiment, in the process step shown in FIG. 3D, planarization of the silicon nitride film 23a is performed using CMP to the extent that the top of a portion of the silicon nitride film 23a located on the trench isolation 13 is exposed. According to this embodiment, in the same process step, the silicon nitride film 23a is planarized using CMP until the top of the trench isolation 13 is exposed. Thus, an oxygen-passage-suppression film 41 is formed to fill the depression 22 in the upper edge of the trench isolation 13. Then, the top of a portion of the trench isolation 13 excluding the upper edge thereof and the top of the oxygen-passage-suppression film 41 are planarized.

According to this embodiment, the effects similar to those of the first embodiment can be obtained. In addition, a level difference on the substrate can be reduced.

Although the above-mentioned two embodiments describe the case where the oxygen-passage-suppression film 23 is made of a silicon nitride film, the other materials may be employed as the oxygen-passage-suppression film 23 in the present invention. For example, polycrystalline silicon can be employed.

A silicon substrate or an SOI (substrate on insulator) substrate may be employed as a semiconductor substrate in the above-mentioned two embodiments.

What is claimed is:

1. A semiconductor device comprising:
   a semiconductor layer including an element formation region;
   a trench isolation surrounding the element formation region of the semiconductor layer; and
   a coating film having the property of suppressing passage of oxygen, said coating film covering at least a portion of the trench isolation and a portion of the element formation region astride the border between the trench isolation and the element formation region.

2. The semiconductor device of claim 1, wherein the coating film directly contacts the semiconductor layer.

3. The semiconductor device of claim 1, further comprising an element including:
   source/drain regions provided in the element formation region of the semiconductor layer;
   a gate dielectric formed by thermally oxidizing the top of the element formation region of the semiconductor layer; and
   a gate electrode provided on the gate dielectric.

4. The semiconductor device of claim 3, wherein the element is an n-type MISFET.

5. The semiconductor device of claim 1, wherein the coating film is formed of silicon nitride.

6. The semiconductor device of claim 1, wherein a plurality of the element formation regions are provided, and the coating film covers the top of the trench isolation and extends to the tops of the two element formation regions of the semiconductor layer adjacent to the trench isolation.

7. The semiconductor device of claim 1, wherein a depression is provided in the upper edge of the trench isolation, and the coating film extends from the bottom of the depression to the top of the element formation region.

8. A method for fabricating a semiconductor device comprising the steps of:
   (a) forming a trench isolation surrounding an element formation region in a semiconductor layer;
   (b) forming a coating film having the property of suppressing passage of oxygen to lie from the top of the semiconductor layer to the top of the trench isolation; and
   (c) removing a portion of the coating film to form a partial coating film that covers at least a portion of the trench isolation and a portion of the element formation region of the semiconductor layer astride the border between the trench isolation and the element formation region.

9. The method for fabricating a semiconductor device of claim 8, further comprising the steps of:
   (d) thermally oxidizing an upper part of the element formation region of the semiconductor layer after the step (c) to form a gate dielectric;
   (e) forming a gate electrode on the gate dielectric; and
   (f) forming source/drain regions in the element formation region by using the gate electrode as a mask.

10. The method for fabricating a semiconductor device of claim 8, wherein in the step (b), the coating film is formed of silicon nitride.

11. A method for fabricating a semiconductor device comprising the steps of:
   (a) forming a trench isolation surrounding an element formation region in a semiconductor layer;
   (b) forming a mask having an opening allowing the top of the trench isolation and the top of a portion of the element formation region adjacent to the trench isolation to be exposed;
   (c) forming, on the mask, a coating film covering the sides and the bottom of the opening and having the property of suppressing passage of oxygen;
   (d) removing an upper part of the mask and an upper part of the coating film to form a partial coating film that covers a portion of the trench isolation and a portion of the element formation region astride the border between the trench isolation and the element formation region; and
   (e) removing the remaining mask.

12. The method for fabricating a semiconductor device of claim 11, further comprising the steps of:
   (f) thermally oxidizing an upper part of the element formation region of the semiconductor layer after the step (e) to form a gate dielectric;
   (g) forming a gate electrode on the gate dielectric; and
   (h) forming source/drain regions in the element formation region by using the gate electrode as a mask.

13. The method for fabricating a semiconductor device of claim 11, wherein
   in the step (a), a depression is formed in the upper edge of the trench isolation, and
   in the step (d), the partial coating film is formed to extend from the bottom of the depression to the top of the element formation region.

14. The method for fabricating a semiconductor device of claim 11, wherein in the step (c), the coating film is formed of silicon nitride.

* * * * *